(12) United States Patent
Ngo et al.

(10) Patent No.: US 7,001,837 B2
(45) Date of Patent: Feb. 21, 2006

(54) SEMICONDUCTOR WITH TENSILE STRAINED SUBSTRATE AND METHOD OF MAKING THE SAME

(75) Inventors: Minh V. Ngo, Fremont, CA (US); Paul R. Besser, Sunnyvale, CA (US); Ming Ren Lin, Cupertino, CA (US); Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 68 days.

(21) Appl. No.: 10/346,617

(22) Filed: Jan. 17, 2003

(65) Prior Publication Data

US 2004/0142545 A1 Jul. 22, 2004

(51) Int. Cl.
*H01L 21/4763* (2006.01)

(52) U.S. Cl. ............... 438/634; 438/585; 438/595; 438/197; 438/230; 438/618; 438/933

(58) Field of Classification Search ............... 438/585, 438/595, 197, 230, 303, 618, 634, 933
See application file for complete search history.

(56) References Cited

U.S. PATENT DOCUMENTS

| 5,241,214 | A | * | 8/1993 | Herbots et al. | ............... | 257/649 |
| 5,461,250 | A | * | 10/1995 | Burghartz et al. | ............ | 257/347 |
| 5,561,302 | A | * | 10/1996 | Candelaria | ..................... | 257/24 |
| 5,843,816 | A | | 12/1998 | Liaw et al. | | |
| 6,071,784 | A | * | 6/2000 | Mehta et al. | ................ | 438/303 |
| 6,177,338 | B1 | | 1/2001 | Liaw et al. | | |
| 6,211,083 | B1 | | 4/2001 | Yang et al. | | |
| 6,281,132 | B1 | | 8/2001 | Nguyen et al. | | |
| 6,287,916 | B1 | * | 9/2001 | Mehta | ........................ | 438/257 |
| 6,426,285 | B1 | * | 7/2002 | Chen et al. | ................. | 438/624 |
| 6,448,140 | B1 | | 9/2002 | Liaw | | |
| 6,492,216 | B1 | * | 12/2002 | Yeo et al. | .................... | 438/197 |
| 6,503,833 | B1 | * | 1/2003 | Ajmera et al. | .............. | 438/682 |
| 6,544,854 | B1 | * | 4/2003 | Puchner et al. | ............. | 438/308 |
| 6,573,172 | B1 | * | 6/2003 | En et al. | ..................... | 438/626 |
| 6,611,029 | B1 | * | 8/2003 | Ahmed et al. | ............. | 257/365 |
| 6,620,664 | B1 | * | 9/2003 | Ma et al. | .................... | 438/183 |
| 6,680,496 | B1 | * | 1/2004 | Hammond et al. | ......... | 257/192 |
| 6,724,008 | B1 | * | 4/2004 | Fitzergald | ..................... | 257/19 |
| 6,730,576 | B1 | * | 5/2004 | Wang et al. | ................ | 438/413 |
| 6,825,529 | B1 | * | 11/2004 | Chidambarrao et al. | .... | 257/336 |

OTHER PUBLICATIONS

Qi Xiang et al., "25 nm Gate Length Strained Silicon CMOS," Conference Paper presented at IEDM 2002, San Francisco, CA, on Sep. 13, 2002, 3 pp.

Chen, C., et al., "Orientation and Ion-Implanted Transverse Effects in Self-Aligned GaAs MESFET's," IEEE Transactions on Electron Devices, pp. 1470-1481, vol. ED-34, No. 7, Jul. 1987.

* cited by examiner

*Primary Examiner*—Maria F. Guerrero
(74) *Attorney, Agent, or Firm*—Foley & Lardner LLP

(57) ABSTRACT

An exemplary embodiment relates to a method for forming a metal oxide semiconductor field effect transistor (MOSFET). The method includes providing a substrate having a gate formed above the substrate and performing at least one of the following depositing steps: depositing a spacer layer and forming a spacer around a gate and gate insulator located above a layer of silicon above the substrate; depositing an etch stop layer above the spacer, the gate, and the layer of silicon; and depositing a dielectric layer above the etch stop layer. At least one of the depositing a spacer layer, depositing an etch stop layer, and depositing a dielectric layer comprises high compression deposition which increases in tensile strain in the layer of silicon.

13 Claims, 4 Drawing Sheets

SEMICONDUCTOR WITH TENSILE STRAINED SUBSTRATE AND METHOD OF MAKING THE SAME

FIELD OF THE INVENTION

The present disclosure relates generally to integrated circuits and methods of manufacturing integrated circuits. More particularly, the present disclosure relates to a semiconductor having a tensile strained substrate and a method of making such a semiconductor.

BACKGROUND OF THE INVENTION

Semiconductor manufactures utilize a wide variety of techniques to improve the performance of semiconductor devices, such as metal oxide semiconductor field effect transistors (MOSFETs). FIG. 1 shows a conventional MOSFET device. The MOSFET of FIG. 1 is fabricated on a semiconductor substrate 10 within an active area bounded by shallow trench isolations 12 that electrically isolate the active area of the MOSFET from other IC components fabricated on the substrate 10.

The MOSFET is comprised of a gate electrode 14 that is separated from a channel region in the substrate 10 by a thin first gate insulator 16 such as silicon oxide or oxide-nitride-oxide (ONO). To minimize the resistance of the gate 14, the gate 14 is typically formed of a doped semiconductor material such as polysilicon.

The source and drain of the MOSFET are provided as deep source and drain regions 18 formed on opposing sides of the gate 14. Source and drain suicides 20 are formed on the source and drain regions 18 and are comprised of a compound comprising the substrate semiconductor material and a metal such as cobalt (Co) or nickel (Ni) to reduce contact resistance to the source and drain regions 18. The source and drain regions 18 are formed deeply enough to extend beyond the depth to which the source and drain suicides 20 are formed. The source and drain regions 18 are implanted subsequent to the formation of a spacer 28 around the gate 14 and gate insulator 16 which serves as an implantation mask to define the lateral position of the source and drain regions 18 relative to the channel region beneath the gate.

The gate 14 likewise has a silicide 24 formed on its upper surface. The gate structure comprising a polysilicon material and an overlying silicide is sometimes referred to as a polycide gate.

The source and drain of the MOSFET further comprise shallow source and drain extensions 26. As dimensions of the MOSFET are reduced, short channel effects resulting from the small distance between the source and drain cause degradation of MOSFET performance. The use of shallow source and drain extensions 26 rather than deep source and drain regions near the ends of the channel helps to reduce short channel effects. The shallow source and drain extensions are implanted prior to the formation of the spacer 22, and the gate 14 acts as an implantation mask to define the lateral position of the shallow source and drain extensions 26 relative to the channel region 18. Diffusion during subsequent annealing causes the source and drain extensions 26 to extend slightly beneath the gate 14.

One option for increasing the performance of MOSFETs is to enhance the carrier mobility of silicon so as to reduce resistance and power consumption and to increase drive current, frequency response and operating speed. A method of enhancing carrier mobility that has become a focus of recent attention is the use of silicon material to which a tensile strain is applied.

"Strained" silicon may be formed by growing a layer of silicon on a silicon germanium substrate. The silicon germanium lattice is generally more widely spaced than a pure silicon lattice as a result of the presence of the larger germanium atoms in the lattice. Because the atoms of the silicon lattice align with the more widely spread silicon germanium lattice, a tensile strain is created in the silicon layer. The silicon atoms are essentially pulled apart from one another. The amount of tensile strain applied to the silicon lattice increases with the proportion of germanium in the silicon germanium lattice.

Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET using a strained silicon layer is shown in FIG. 2. The MOSFET is fabricated on a substrate comprising a silicon germanium layer 30 on which is formed an epitaxial layer of strained silicon 32. The MOSFET uses conventional MOSFET structures including deep source and drain regions 18, shallow source and drain extensions 26, a gate oxide layer 16, a gate 14 surrounded by spacers 28, 22, silicide source and drain contacts 20, a silicide gate contact 24, and shallow trench isolations 12. The channel region of the MOSFET includes the strained silicon material, which provides enhanced carrier mobility between the source and drain.

One detrimental property of strained silicon MOSFETs of the type shown in FIG. 2 is that the band gap of silicon germanium is lower than that of silicon. In other words, the amount of energy required to move an electron into the conduction band is lower on average in a silicon germanium lattice than in a silicon lattice. As a result, the junction leakage in devices having their source and drain regions formed in silicon germanium is greater than in comparable devices having their source and drain regions formed in silicon.

Another detrimental property of strained silicon MOSFETs of the type shown in FIG. 2 is that the dielectric constant of silicon germanium is higher than that of silicon. As a result, MOSFETs incorporating silicon germanium exhibit higher parasitic capacitance, which increases device power consumption and decreases driving current and frequency response.

Therefore, the advantages achieved by incorporating strained silicon into MOSFET designs are partly offset by the disadvantages resulting from the use of a silicon germanium substrate.

Thus, there is a need for a MOSFET fabrication process in which silicon is strained by the highly compressive deposition of layers on top of the silicon. Further, there is a need to increase tensile strain in a silicon MOSFET without changing a silicon germanium layer. Even further, there is a need to increase carrier mobility using strained silicon.

SUMMARY OF THE INVENTION

An exemplary embodiment relates to a method for forming a metal oxide semiconductor field effect transistor (MOSFET). The method includes providing a substrate having a gate formed above the substrate and performing at least one of the following depositing steps: depositing a spacer layer and forming a spacer around a gate and gate insulator located above a layer of silicon above the substrate; depositing an etch stop layer above the spacer, the gate, and the layer of silicon; and depositing a dielectric layer above the etch stop layer. At least one of the depositing a spacer layer, depositing an etch stop layer, and depositing a dielectric layer comprises high compression deposition which increases in tensile strain in the layer of silicon.

Another exemplary embodiment relates to a method for forming a metal oxide semiconductor field effect transistor (MOSFET) including providing a substrate comprising a layer of silicon germanium having a layer of silicon material formed thereon, and at least one of a gate insulating layer formed on the silicon layer, and a gate conductive layer formed on the gate insulating layer. The method also includes patterning the gate conductive layer and a gate insulating layer to form a gate and gate insulator over the silicon layer; forming a spacer around the gate and gate insulator; forming an etch stop layer above the spacer, and the gate, and forming an interlevel dielectric layer above the etch stop layer in a highly compressive deposition process that compresses the layer of silicon, causing increased tensile strain therein.

Another exemplary embodiment relates to a method of processing a transistor comprising providing a gate above a silicon layer where the gate has spacers located proximate lateral sidewalls of the gate; forming an etch stop layer above the gate, and spacers, where the etch stop layer is formed in a high compression deposition causing strain in the silicon layer; and forming a dielectric layer above the etch stop layer, where the dielectric layer is formed in a high compression deposition causing strain in the silicon layer.

Other principle features and advantages of the invention will become apparent to those skilled in the art upon review of the following drawings, the detailed description, and the appended claims.

BRIEF DESCRIPTION OF THE DRAWINGS

The exemplary embodiments of the disclosure will hereafter be described with reference to the accompanying drawings, wherein like numerals denote like elements, and.

DETAILED DESCRIPTION OF EXEMPLARY EMBODIMENTS

Figure 1:
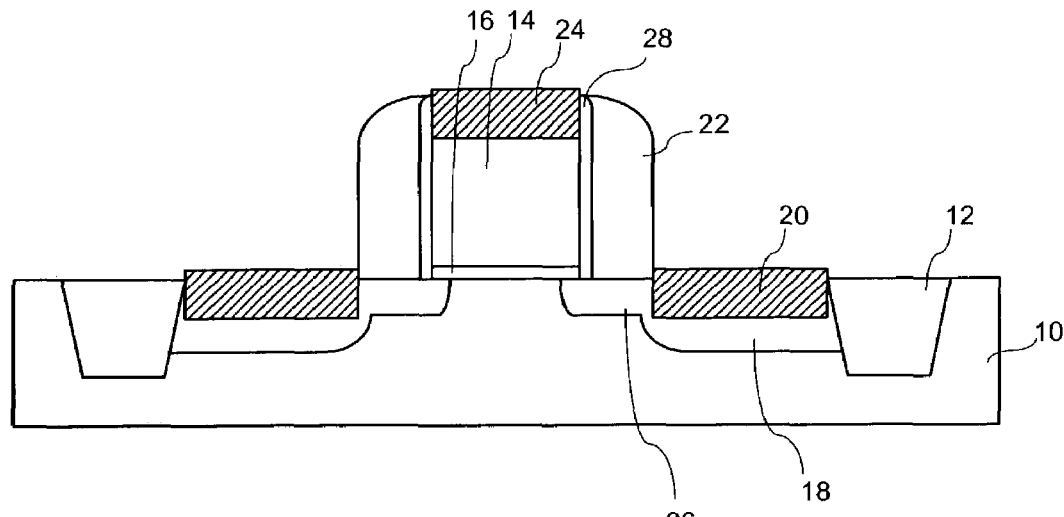
FIG. 1 is a schematic cross-sectional view representation of a conventional MOSFET formed in accordance with conventional processing.
Figure 2:
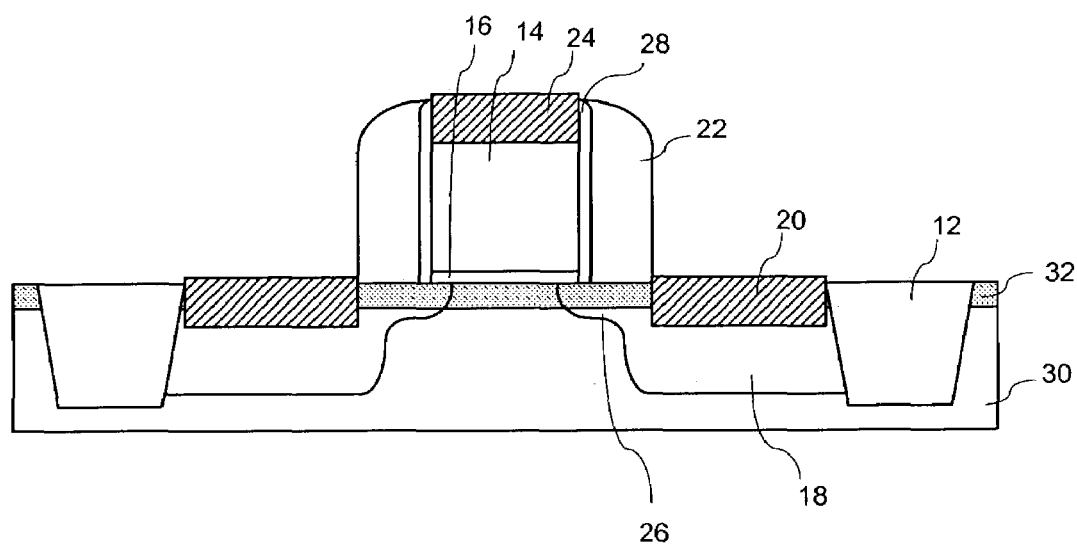
FIG. 2 is a schematic cross-sectional view representation of a strained silicon MOSFET device formed in accordance with the conventional processing used to form the MOSFET of FIG. 1.
Figure 3A:
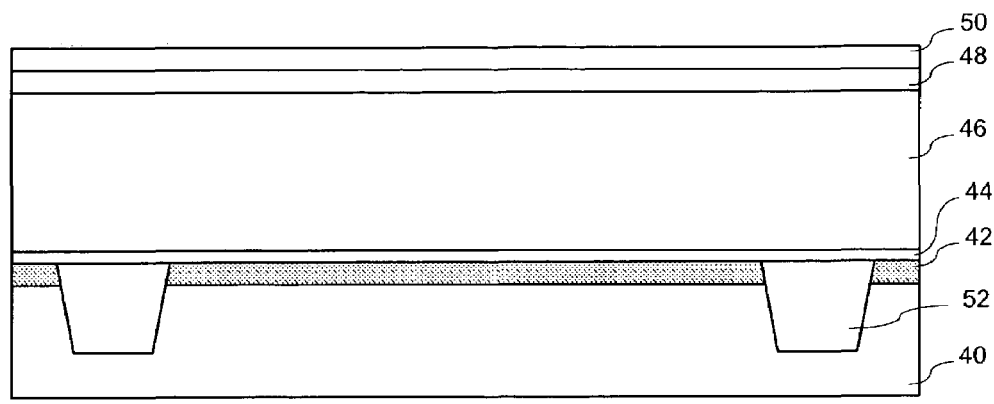
FIGS. 3a–3e are schematic cross-sectional view representations of structures formed during production of a MOSFET device in accordance with an exemplary embodiment.

FIGS. 3a–3i illustrate structures formed during fabrication of a strained silicon MOSFET in accordance with an exemplary embodiment. FIG. 3a shows a structure comprising a layer of silicon germanium 40 having an epitaxial layer of silicon 42 formed on its surface. The silicon germanium layer 40 preferably has a composition $Si_{1-x}Ge_x$, where x is approximately 0.2, and is more generally in the range of 0.1 to 0.3.

The silicon germanium layer 40 is typically grown on a silicon wafer. Silicon germanium may be grown, for example, by chemical vapor deposition using $Si_2H_6$ (disilane) and $GeH_4$ (germane) as source gases, with a substrate temperature of 600 to 900 degrees C., a $Si_2H_6$ partial pressure of 30 mPa, and a $GeH_4$ partial pressure of 60 mPa. $SiH_4$ (silane) may be used in alternative processes. Growth of the silicon germanium material may be initiated using these ratios, or alternatively the partial pressure of $GeH_4$ may be gradually increased beginning from a lower pressure or zero pressure to form a gradient composition. The thickness of the silicon germanium layer may be determined in accordance with the particular application. The upper portion of the silicon germanium substrate 40 on which the strained silicon layer 42 is grown should have a uniform composition.

The silicon layer 42 is preferably grown by chemical vapor deposition (CVD) using $Si_2H_6$ as a source gas with a partial pressure of 30 mPa and a substrate temperature of approximately 600 to 900 degrees C. The silicon layer 42 is preferably grown to a thickness of 200 nm.

As further shown in FIG. 3a, a gate insulating layer 44 is formed on the silicon layer 42. The gate insulating layer 44 is typically silicon oxide but may be another material such as oxide-nitride-oxide (ONO). An oxide may be grown by thermal oxidation of the strained silicon layer, but is preferably deposited by chemical vapor deposition.

Formed over the gate insulating layer 44 is a gate conductive layer 46. The gate conductive layer 46 typically comprises polysilicon but may alternatively comprise another material such as polysilicon implanted with germanium.

Overlying the gate conductive layer 46 is a bi-layer hardmask structure comprising a bottom hardmask layer 48, also referred to as a bottom antireflective coating (BARC), and an upper hardmask layer 50. The bottom hardmask layer 48 is typically silicon oxide (e.g. $SiO_2$) and the upper hardmask layer 50 is typically silicon nitride (e.g. $Si_3N_4$).

The silicon germanium substrate also has formed therein shallow trench isolations 52. The shallow trench isolations may be formed by forming trenches having tapered sidewalls in the silicon germanium layer 40 and silicon layer 42, performing a brief thermal oxidation, and then depositing a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process, leaving shallow trench isolations 52 that are approximately level with the surface of the silicon layer 42.

Figure 3B:
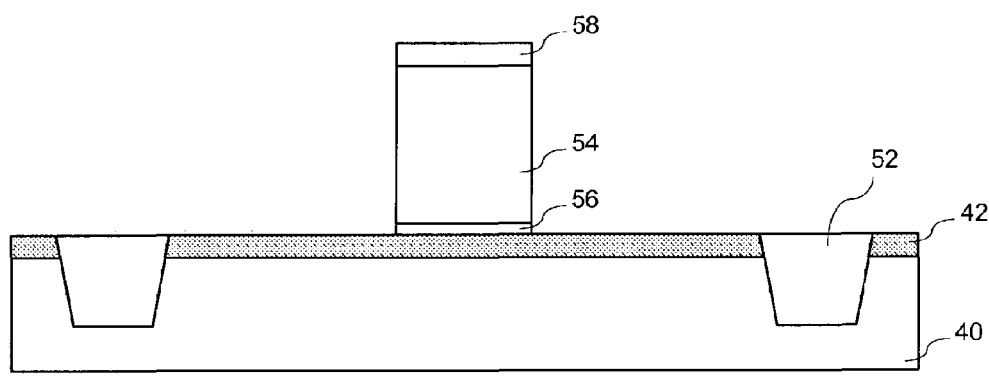

FIG. 3b shows the structure of FIG. 3a after patterning of the gate conductive layer and gate insulating layer to form a gate 54 and a self-aligned gate insulator 56. Patterning is performed using a series of anisotropic etches that pattern the upper hardmask layer 50 using a photoresist mask as an etch mask, then patterns the lower hardmask layer 48 using the patterned upper hardmask layer 50 as an etch mask, then patterns the polysilicon using the patterned lower hardmask layer 48 as an etch mask, then patterns the gate insulating layer using the gate 54 as a hardmask. As shown in FIG. 3*b*, the thickness of the lower hardmask layer 48 is chosen such that after patterning of the gate insulating layer, a portion of the lower hardmask layer remains on the gate as a protective cap 58.

Figure 3C:
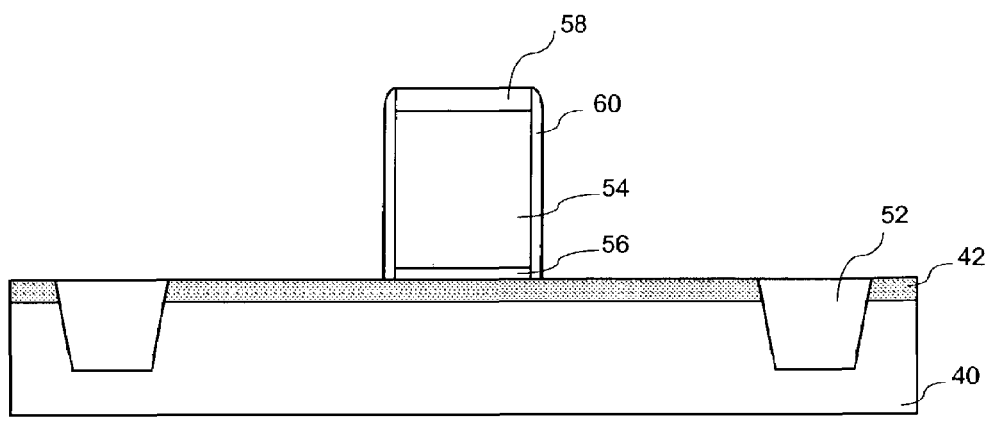

FIG. 3*c* shows the structure of FIG. 3*b* after formation of spacers 60 around the gate 54, the gate insulator 56 and the protective cap 58. The spacers 60 are preferably formed by deposition of a conformal layer of a protective material, followed by anisotropic etching to remove the protective material from the non-vertical surfaces to leave the spacers 60. The spacers 60 are preferably formed of silicon oxide or silicon nitride.

In an exemplary embodiment, the conformal layer used in forming the spacers 60 is deposited using a plasma enhanced chemical vapor deposition (PECVD) process. This PECVD process is preferably a high compression deposition that adds tensile strain to the silicon layer 42. High compression deposition can be achieved by biased RF power resulting in higher ion bombardment and compression to the silicon layer 42.

Figure 3D:
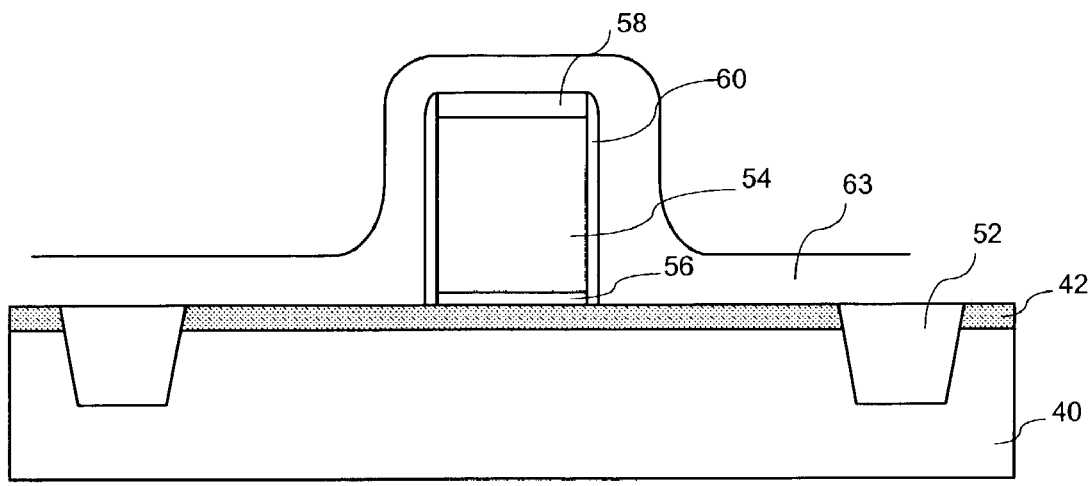

FIG. 3*d* shows the structure of FIG. 3*c* after deposition of an etch stop layer (ESL) 63 conformally over the gate 54, the protective cap 58, the spacers 60, and the silicon layer 42. In an exemplary embodiment, the etch stop layer 63 is deposited in a PECVD process with high compression as to increase tensile strain in the silicon layer 42. High compression deposition can be achieved with increased ion bombardment.

Figure 3E:
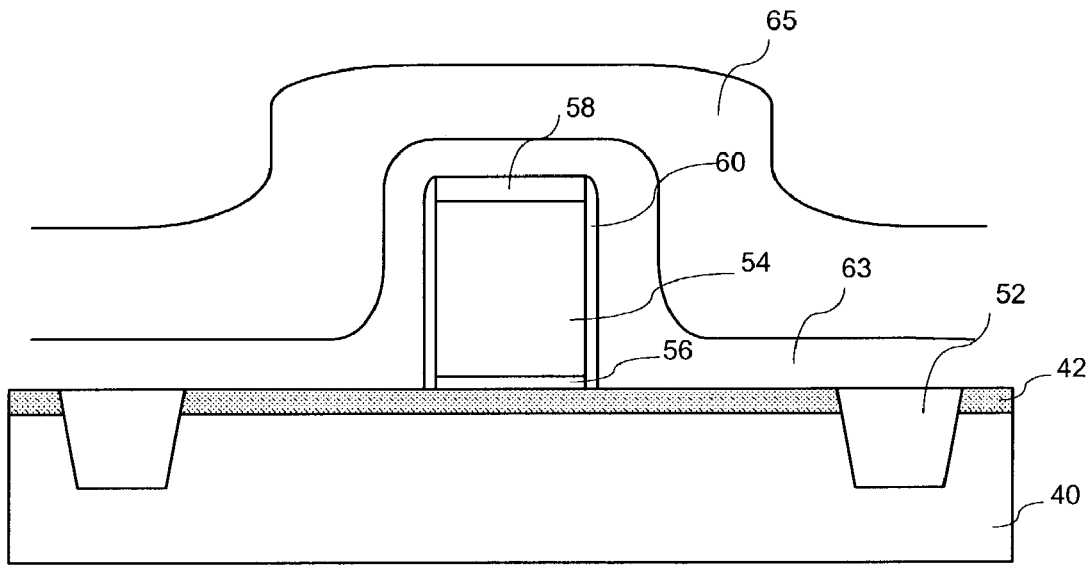

FIG. 3*e* shows the structure of FIG. 3*d* after deposition of an interlevel dielectric (ILD) layer 65. The ILD layer 65 is conformally deposited over the etch stop layer 63. Preferably, the ILD layer 65 is deposited in a highly compressive PECVD process. The high compression deposition increases compression in the silicon layer 42 adding tensile strain and, thereby, enhancing carrier mobility.

Other layers can be deposited, such as a liner layer or another spacer layer. Such additional layers can also be deposited with high compression deposition techniques as to increase the tensile strain in the silicon layer 42.

While the processing shown in FIGS. 3*a*–3*e* represents a presently preferred embodiment, a variety of alternatives may be implemented. Accordingly, a variety of embodiments in accordance with the invention may be implemented. In general terms, such embodiments encompass a MOSFET that includes a strained silicon channel region on a silicon germanium layer, and source and drain regions formed in silicon regions that are provided at opposing sides of the gate. The depth of the source and drain regions does not extend beyond the depth of the silicon regions, thus reducing the detrimental junction leakage and parasitic capacitance of conventional silicon germanium implementations.

In an alternative embodiment, a diffusion furnace can be used after processing SiGe to process non-SiGe material by running a wet oxidation clean-up cycle. This wet oxidation cycle includes a high temperature $H_2O$ oxidation to convert Ge to Ge-oxide, which is volatile. Such a process can be repeated to reduce contamination to below detection limits.

In another alternative embodiment, the strained-Si technology can be combined with fully-depleted silicon on insulator (SOI). However, a challenge exists in that the strained silicon is supported by an underlying SiGe layer and the strain may disappear when the SiGe is removed. The strain can be maintained by introducing a single-crystal high-k material that has a similar lattice constant with SiGe. For example, 20% SiGe can be achieved with $DySiO_3$ or $GdSiO_3$.

In another alternative embodiment, an epoxy seal or a seal of another suitable material is applied to the top surface of a silicon die. By modifying the properties of the seal material, the stress in the silicon die can be modified to induce tensile stress. As discussed above tensile stress improves carrier mobility, improving device speed. Another way of increasing tensile stress is by using a dome-shaped metal substrate on which the die can be placed. The dome shape can be manufactured by stamping or etching. The dome shape provides a physical stress to the silicon die, resulting in tensile stress.

Figure 4:
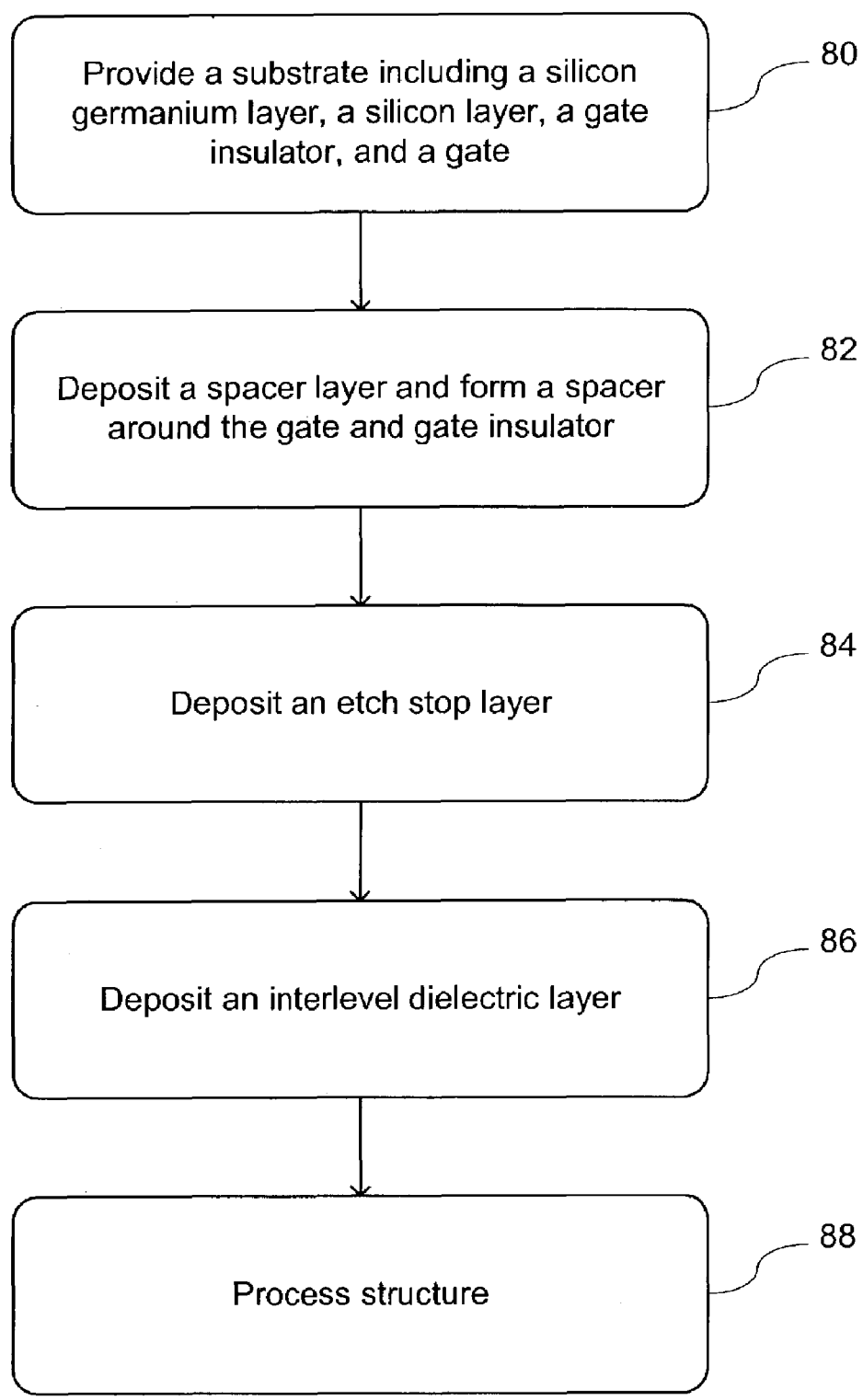
FIG. 4 is a process flow encompassing an exemplary embodiment and alternative embodiments.

FIG. 4 shows a process flow encompassing the preferred embodiment of FIGS. 3*a*–3*e*, the aforementioned alternatives and other alternatives. Initially, a substrate is provided in an operation 80. The substrate includes a layer of silicon germanium having a layer of silicon formed thereon. The substrate further includes a gate insulator formed on the strained silicon layer and a gate formed on the gate insulator. A spacer layer is deposited and a spacer is formed around the gate and gate insulator in an operation 82. In an exemplary embodiment, the spacer layer is deposited in a highly compressive fashion causing compression and, thus, tensile strain in the silicon layer below.

An etch step layer is provided conformally above the gate, spacer, and silicon layers in an operation 84. In an exemplary embodiment, the etch stop layer is deposited in a high compression fashion, increasing the tensile strain in the silicon layer. An interlevel dielectric layer (ILD) layer is deposited above the etch stop layer in an operation 86. Alternatively, any layer material can be deposited. In an exemplary embodiment, the ILD layer is deposited in a high compression PECVD process. A high compression deposition can be utilized with at least one of the depositions of operations 82, 84, and 86. Alternatively, the high compression deposition can be used in all three operations 82, 84, and 86. In an operation 88, the structure is processed including formation of any of a variety of features, such as contacts for source and drain regions, metal interconnection, IMD layers, and passivation layer.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above.

The process described in the description of exemplary embodiments need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed invention and equivalents.

What is claimed is:

1. A method for forming a metal oxide semiconductor field effect transistor (MOSFET), comprising:
   providing a substrate having a gate formed above the substrate;
   depositing a spacer layer and forming a spacer around a gate and gate insulator located above a layer of silicon above the substrate; and
   increasing tensile strain in the layer of silicon by depositing an etch stop layer above the spacer, the gate, and the layer of silicon; and
   depositing a dielectric layer above the etch stop layer.

2. The method claimed in claim 1, further comprising depositing a liner using biased RF power for high ion bombardment.

3. The method claimed in claim 1, wherein the layer of silicon has a thickness of at least 200 nm.

4. The method claimed in claim 1, wherein the substrate includes a silicon germanium layer having a composition $Si_{1-x}Ge_x$, where x is in the range of 0.1 to 0.3.

5. The method claimed in claim 1, wherein the gate comprises polysilicon.

6. The method claimed in claim 1, wherein the silicon regions are formed in trenches in the layer of silicon by selective epitaxial growth.

7. The method claimed in claim 1, wherein the substrate further comprises shallow trench isolations.

8. The method claimed in claim 1, further comprising implanting deep source and drain regions.

9. The method claimed in claim 1, wherein depositing the spacer layer, depositing the etch stop layer, and depositing the dielectric layer all include high compression techniques.

10. The method claimed in claim 1, wherein providing the substrate comprises:
    patterning a gate conductive layer and a gate insulating layer to form said gate and gate insulator over the silicon layer.

11. The method claimed in claim 9, wherein the high compression techniques include high ion bombardment.

12. The method claimed in claim 10, wherein providing the substrate further comprises:
    forming a thin spacer around the gate; and
    implanting shallow source and drain extensions, wherein said spacer is formed around said thin spacer.

13. The method claimed in claim 12, wherein implanting source and drain extensions is preceded by implanting halo regions at opposing sides of a channel region, the halo regions extending toward the channel region beyond ends of the source and drain extensions to be formed, the halo regions comprising a dopant having a conductivity type opposite to the conductivity type of a dopant of the source and drain extensions.

* * * * *